United States Patent
Marshall et al.

(10) Patent No.: US 6,828,828 B2
(45) Date of Patent: *Dec. 7, 2004

(54) DYNAMIC CONTROL OF SWITCHING REFERENCE VOLTAGE

(75) Inventors: David John Marshall, Fort Collins, CO (US); Karl Joseph B is, Fort Collins, CO (US); David W. Quint, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/921,471

(22) Filed: Aug. 3, 2001

(65) Prior Publication Data

US 2003/0025544 A1 Feb. 6, 2003

(51) Int. Cl.[7] .................................................. H03K 5/22
(52) U.S. Cl. ........................................ 327/68; 327/205
(58) Field of Search ................................ 327/198, 199, 327/205, 200, 99, 51, 52, 54, 56, 68, 58, 72, 73, 76–80, 89, 90, 307; 341/144, 146, 151, 154

(56) References Cited

U.S. PATENT DOCUMENTS

| | | | | |
|---|---|---|---|---|
| 4,527,148 A | * | 7/1985 | Kuboki et al. | 341/148 |
| 4,574,206 A | * | 3/1986 | Todokoro et al. | 327/68 |
| 4,904,947 A | * | 2/1990 | Olivenbaum et al. | 327/37 |
| 5,136,382 A | * | 8/1992 | Meyer | 348/465 |
| 5,233,329 A | * | 8/1993 | Lippmann et al. | 340/438 |
| 5,376,834 A | * | 12/1994 | Carobolante | 327/143 |
| 5,712,475 A | * | 1/1998 | Ohno | 250/214 DC |
| 6,111,443 A | * | 8/2000 | Mores et al. | 327/206 |
| 6,225,929 B1 | * | 5/2001 | Beck | 341/144 |

* cited by examiner

*Primary Examiner*—Minh Nguyen
(74) *Attorney, Agent, or Firm*—Alexander J. Neudeck

(57) ABSTRACT

A reference voltage is moved dynamically towards a voltage level of the last received value. The movement takes place over a predetermined fraction of a bit-time. The amount of movement is limited so that successive logical values don't result in an unusable reference voltage level. When the output of a receiver changes, a state machine sequences the selection of analog reference voltage inputs to a multiplexer to move an output reference voltage towards a steady-state signal voltage level for the value that was just received. When the sequence is complete, the state machine keeps the last value selected on the output until the output of the receiver changes value.

6 Claims, 3 Drawing Sheets

DYNAMIC CONTROL OF SWITCHING REFERENCE VOLTAGE

FIELD OF THE INVENTION

This invention relates generally to electronic circuits and more particularly to methods and circuits for receiving digital electronic signals.

BACKGROUND OF THE INVENTION

Digital electronic signals are used to communicate digital information. This communication may be from one device to another, one integrated circuit (or chip) to another, or within an integrated circuit itself. In many of these applications, the difference between the voltage level that denotes a "high" (or logical "1") and the voltage level that denotes a "low" (or logical "0") has been getting smaller. Designers have chosen these smaller differentials for reasons that include: lower power supply voltages, increasing switching speed, lowering power consumption, and the use of standard bus interfaces that have defined smaller voltage differentials.

Unfortunately, these smaller voltage differentials are harder to detect, especially in the presence of noise or other non-idealities on the signal. Accordingly, there is a need in the art for improvements that help with the detection and reception of digital signals having small voltage differentials between logical levels.

SUMMARY OF THE INVENTION

A reference voltage is moved dynamically towards a voltage level of the last received value. The movement takes place over a predetermined fraction of a bit time. The amount of movement is limited so that successive logical values don't result in an unusable reference voltage level.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
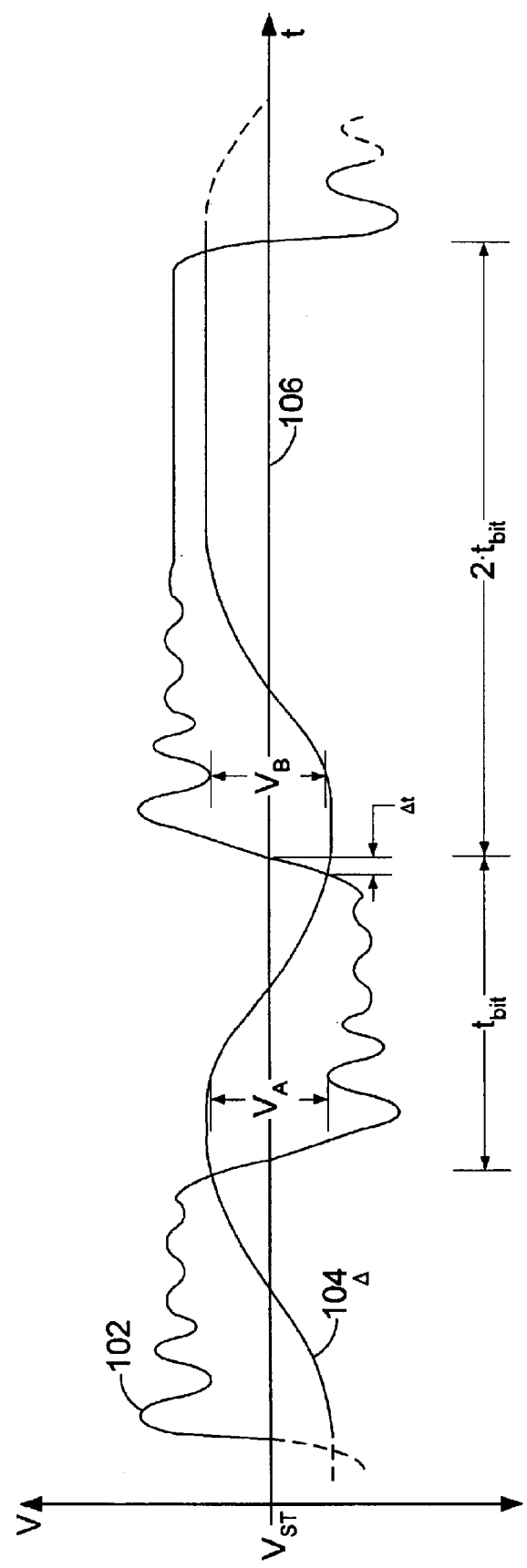
FIG. 1 is voltage vs. time plot of an exemplary input signal, a dynamically controlled reference voltage, and a static reference voltage.

FIG. 1 is voltage vs. time plot of an exemplary input signal 102, a dynamically controlled reference voltage 104, and a static reference voltage 106. In FIG. 1, note how the dynamically controlled reference voltage 104 moves toward the voltage level of the exemplary input signal 102 after each transition of the exemplary input signal 102. The movement is shown taking place over a period of time that approximates one-half a bit-time, $t_{bit}$. A bit-time is the normal period of the maximum data frequency. Once the dynamically controlled reference voltage 104 reaches a predetermined level, it stays approximately constant until another transition takes place on the input signal 102.

$V_A$ and $V_B$ illustrate the minimum voltage differential between the input signal 102 and the dynamically controlled reference voltage 102 shortly after a transition. This minimum voltage differential may eventually become smaller as the dynamically controlled reference voltage 104 moves toward the input signal 102, but by then, much of the noise on the input signal 102 has settled out so the input signal 102 doesn't cross the dynamically controlled reference voltage 104. Note that $V_A$ and $V_B$ are both larger than the minimum voltage differential between the input signal 102 and the static reference voltage 106 at the same point in time. Accordingly, at this critical time shortly after an input signal 102 transition, the noise margin for the dynamically controlled reference signal 104 is larger than the noise margin for the static reference signal 106.

Also note that, as shown in FIG. 1, it takes less time for the input signal 102 to cross the dynamically controlled reference voltage 104 than it does the static reference voltage 106. This is shown as Δt in FIG. 1. Since the dynamically controlled reference voltage 104 has moved closer to the input signal 102 voltage than the static reference voltage 106 (which does not move) near the end of each bit-time, an input signal 102 transition with a non-infinite slope crosses the dynamically controlled reference voltage 104 level sooner than it crosses the static reference voltage 106 level. This illustrates that an input signal 102 transition can be detected faster with the dynamically controlled reference voltage 104 than it can be detected with a static reference voltage 106.

Figure 2:
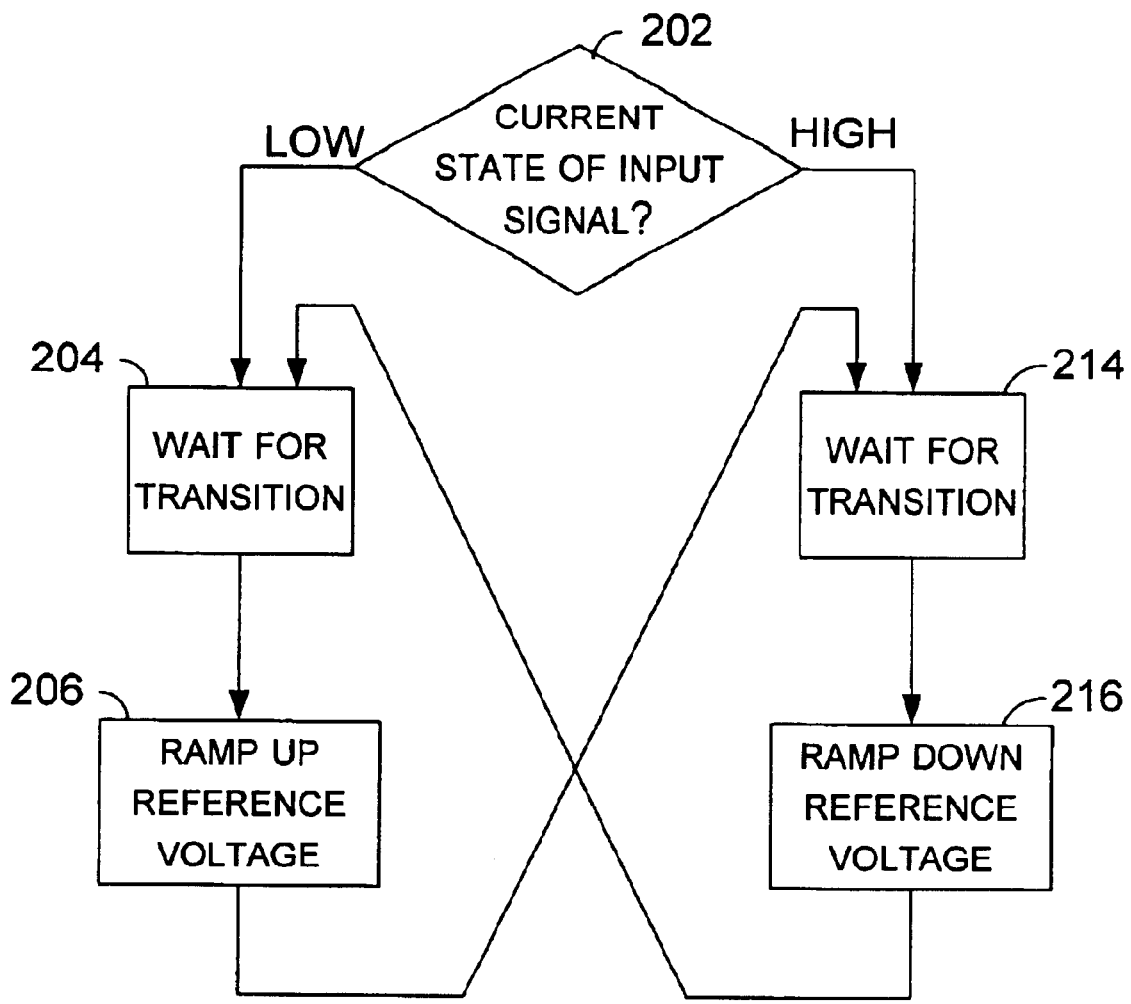
FIG. 2 is a flowchart illustrating steps to dynamically control a reference voltage.

FIG. 2 is a flowchart illustrating steps to dynamically control a reference voltage. In a step 202, an initialization decision is made. If the current state of the input signal is at a high voltage, flow proceeds to step 214. If the current state of the input signal is a low voltage, flow proceeds to step 204. In a step 204, the system waits for a transition. Since it was determined in step 202 that the current state of the input signal was at a low voltage, or because flow to step 204 came from step 216 just after a high-to-low transition, the transition in step 204 would be a low-to-high transition. After this transition, flow proceeds to step 206. In a step 206, the reference voltage is ramped-up from its present voltage to a higher voltage. Flow then proceeds to step 214.

In a step 214, the system waits for a transition. Since it was determined in step 202 that the current state of the input signal was at a high voltage, or because flow to step 214 came from step 206 just after a low-to-high transition, the transition in step 214 would be a high-to-low transition. After this transition, flow proceeds to step 216. In a step 216, the reference voltage is ramped-up from its present voltage to a higher voltage. Flow then proceeds to step 204.

Figure 3:
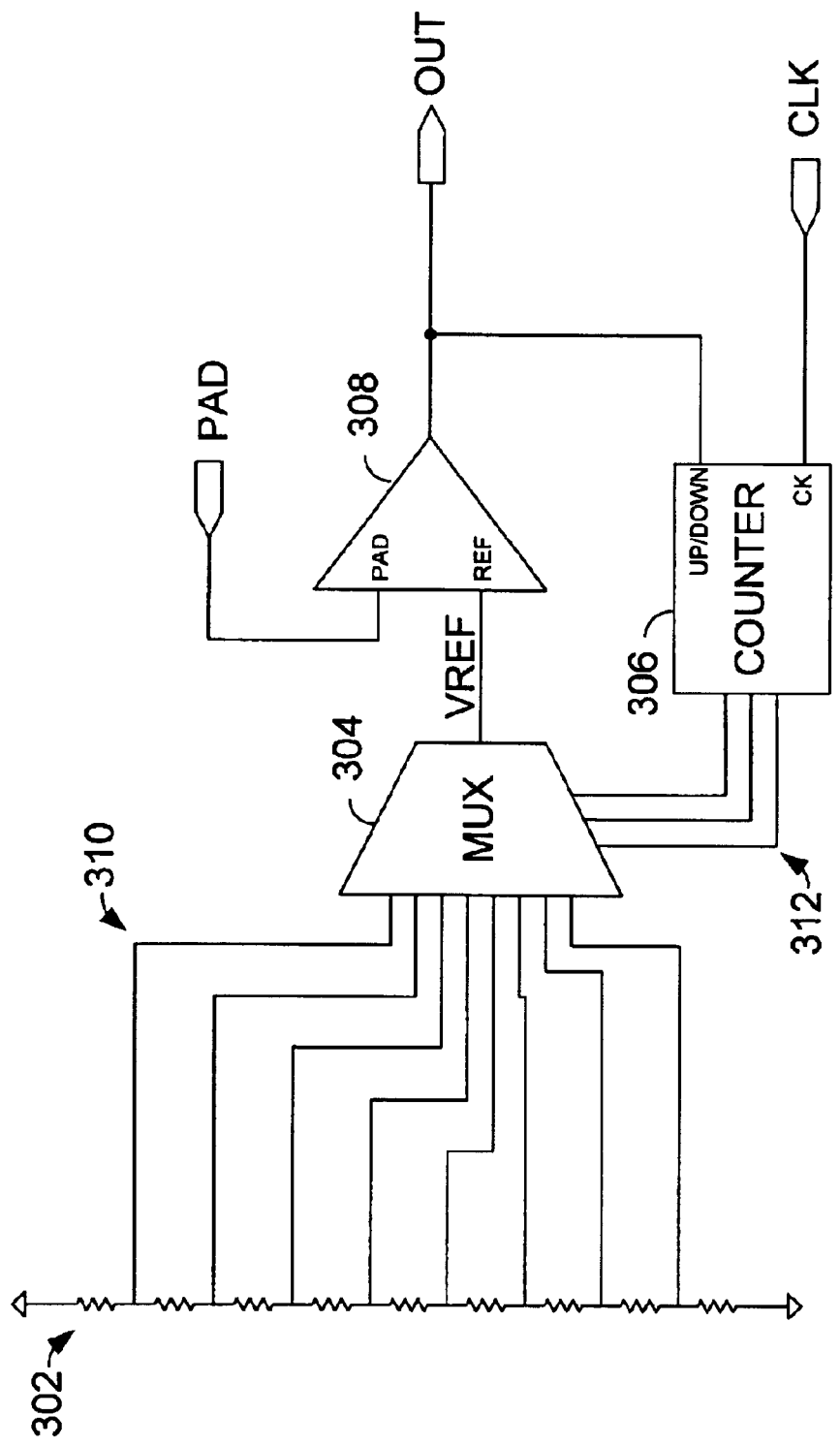
FIG. 3 is a schematic diagram illustrating a circuit that dynamically controls a reference voltage.

FIG. 3 is a schematic diagram illustrating a circuit that dynamically controls a reference voltage. In FIG. 3, a resistive ladder network 302 provides numerous different voltages to an analog multiplexer (MUX) 304 via analog signal lines 310. One of these numerous different voltages is selected, according to the digital values on counter outputs 312, by MUX 304, which outputs a dynamically controlled reference voltage, VREF. Resistive ladder 302 may divide down the supply voltages or another reference voltage supplied to it to generate these different voltages.

Differential receiver 308 has two inputs, REF and PAD. The PAD input is connected to the input signal being received. The REF input is connected to the dynamically controlled reference voltage, VREF. If the voltage on REF is greater than PAD, then differential receiver 308 drives signal OUT to a logical "I". If the voltage on REF is less than PAD, then differential receiver 308 drives signal OUT to a logical "0".

Signal OUT also controls the direction of saturating binary counter 306. By saturating binary counter it is meant that the counter outputs 312 of counter 306 do not "rollover" from their lowest value to their highest value when counting down and do not "rollover" from their highest value to their lowest value when counting up. Instead, the counter outputs 312 reach these values and hold them until the direction control (UP/DOWN) changes state.

Counter 306 is clocked by a clock signal CK. CK typically runs at a rate that is much faster than each bit-time so that during the course of one bit-time, counter 306 could count from its lowest output value to its highest output value and visa-versa.

To illustrate the operation of the circuit shown in FIG. 3, assume that the PAD signal is at a lower voltage than the lowest analog voltage generated by resistive ladder 302 which is being output by MUX 304 as VREF and that it has been that way long enough for OUT to have commanded counter 306 to count down for enough time that counter outputs 312 have saturated at their lowest value. This is a static state as long as the voltage on PAD does not exceed VREF.

Now assume that the voltage on PAD changes from a low voltage level to a high voltage level similar to one of the changes shown in FIG. 1. This change causes PAD input to differential receiver to be higher than VREF so that differential receiver 308 changes the state of its output causing counter 306 to begin counting up with each cycle of CLK. As counter 306 counts up, counter outputs 312 cause MUX 304 to successively select increasing analog voltages generated by resistive ladder 302 with each cycle of CLK and place these successively increasing analog voltages on VREF. This results in a movement of the dynamically controlled reference voltage, VREF, moving towards a voltage level of the received voltage level on PAD. This process continues until counter outputs 312 saturate at their highest value. At this time, MUX 304 is selecting the highest analog voltage generated by resistive ladder 302 and VREF stabilizes at this voltage level until PAD changes to a voltage level lower than VREF. This process is reversed with counter outputs 312 counting down and VREF successively decreasing when PAD changes from a high voltage level to a low voltage level similar to one of the changes shown in FIG. 1.

As shown in FIG. 1, it would be typical for the highest voltage generated by resistive ladder 302 to be less than the expected long-term steady state high voltage on PAD. Likewise, it would be typical for the lowest voltage generated by resistive ladder 302 to be more than the expected long-term steady state low voltage on PAD. Finally, it would also be typical for CLK to be about 2N times faster than the fastest cycle time of the signal on PAD, there N is the number of inputs to MUX 304. This results in a typical transition time for VREF of about ½ a bit-time of the input signal on PAD. Note that almost any combination of CLK frequency and number of inputs, N, could be chosen. Values even as large or larger than 1.5 times a bit time or as small or smaller than 0.25 a bit time may be desirable depending upon the characteristics of the input signal.

Although a specific embodiment of the invention has been described and illustrated, the invention is not to be limited to the specific forms or arrangements of parts so described and illustrated. The invention is limited only by the claims.

What is claimed is:

1. A method of receiving a digital signal, comprising:

comparing said digital signal to a reference voltage;

determining when said digital signal has changed from being greater than said reference voltage to being less than said reference voltage; and reducing said reference voltage after said digital signal has changed from being greater than said reference voltage to being less than said reference voltage, wherein said reference voltage is reduced from a highest reference voltage to a lowest reference voltage through a plurality of intermediate reference voltages during a single half-cycle of said digital signal by selecting different nodes on a resistive ladder to provide said reference voltage.

2. The method of claim 1 wherein said reference voltage is reduced over a period of time that is greater than an expected period of time for said digital signal to change from one digital state to another.

3. A method of receiving a digital signal, comprising:

comparing said digital signal to a reference voltage;

determining when said digital signal has changed from being less than said reference voltage to being greater than said reference voltage; and, increasing said reference voltage after said digital signal has changed from being less than said reference voltage to being greater than said reference voltage, wherein said reference voltage is increased front a lowest reference voltage to a highest reference voltage through a plurality of intermediate reference voltages during a single half-cycle of said digital signal by selecting different nodes on a resistive ladder to provide said reference voltage.

4. The method of claim 3 wherein said reference voltage is increased over a period of time that is greater than an expected period of time for said digital signal to change from one digital state to another.

5. A method, comprising:

adjusting a reference between a first nominal reference level and a second nominal reference level through a plurality of intermediate reference levels during a single half-cycle of an input signal by selecting among a plurality of nodes on a resistive ladder as a source for said reference;

adjusting said reference between said second nominal reference level and said first nominal reference level through said plurality of intermediate reference levels during another half-cycle of said input signal by selecting among said plurality of nodes on said resistive ladder as a source for said reference;

comparing said input to said first nominal reference level when said input signal is closer to said first nominal reference level than said second nominal reference level; and, comparing said input signal to said second nominal reference level when said input signal is closer to said second nominal reference level than said first nominal reference level.

6. The method of claim 5 wherein said steps of comparing are used to initiate said steps of adjusting so that said reference becomes closer to said first nominal reference level after said input signal has crossed said second nominal reference level and so that said reference becomes closer to said second nominal reference level after said input signal has crossed said first nominal reference level.

* * * * *